US012582015B2

(12) United States Patent　　(10) Patent No.:　US 12,582,015 B2

Iwata et al.　　(45) Date of Patent:　Mar. 17, 2026

(54) TERMINAL STRUCTURE AND ELECTRONIC COMPONENT

(71) Applicant: Murata Manufacturing Co., Ltd., Nagaokakyo (JP)

(72) Inventors: Mitsuo Iwata, Nagaokakyo (JP); Osamu Yamaguchi, Nagaokakyo (JP); Yuki Asano, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 359 days.

(21) Appl. No.: 18/523,058

(22) Filed: Nov. 29, 2023

(65) Prior Publication Data

US 2024/0096772 A1　　Mar. 21, 2024

Related U.S. Application Data

(63) Continuation of application No. PCT/JP2022/014934, filed on Mar. 28, 2022.

(30) Foreign Application Priority Data

May 31, 2021　(JP) .................................. 2021-091922

(51) Int. Cl.
H01L 23/498　　(2006.01)
H05K 1/02　　(2006.01)
(Continued)

(52) U.S. Cl.
CPC ...... H01L 23/49811 (2013.01); H05K 1/0237 (2013.01); *H01L 23/3121* (2013.01);
(Continued)

(58) Field of Classification Search
CPC ..................................................... H05K 1/0237
(Continued)

(56) References Cited

U.S. PATENT DOCUMENTS 12,495,494 B2 *　12/2025　Chun ....................... H05K 1/09
2019/0132962 A1　5/2019　Harazono et al.
(Continued)

FOREIGN PATENT DOCUMENTS

JP　2003-124636 A　4/2003
JP　2005-136042 A　5/2005
(Continued)

OTHER PUBLICATIONS

International Search Report for PCT/JP2022/014934 dated May 31, 2022.

*Primary Examiner* — Stanley Tso
(74) *Attorney, Agent, or Firm* — McDonald Hopkins LLC

(57) ABSTRACT

A plurality of first terminal pins are placed side by side in a first direction. A plurality of second terminal pins are placed to extend in parallel with the plurality of first terminal pins. The plurality of first terminal pins and the plurality of second terminal pins include an inside face facing each other, an outside face opposite to the inside face, and side faces connecting the inside face and the outside face. At least one of the side faces includes a first portion having a relatively rough surface, and a second portion having a relatively fine surface and having approximately the same roughness as the inside face and the outside face.

13 Claims, 9 Drawing Sheets

(51) Int. Cl.
　　*H01L 23/31* 　　　　(2006.01)
　　*H05K 1/185* 　　　　(2026.01)

(52) U.S. Cl.
　　CPC ... *H05K 1/185* (2013.01); *H05K 2201/10015*
　　　　　(2013.01); *H05K 2201/10022* (2013.01); *H05K*
　　　　　　　　　　　　　　　　　　　*2201/1003* (2013.01)

(58) Field of Classification Search
　　USPC ........................................................ 174/250
　　See application file for complete search history.

(56)　　　　　　　　　References Cited

U.S. PATENT DOCUMENTS

| | | |
|---|---|---|
| 2021/0050285 A1 | 2/2021 | Takao |
| 2025/0081330 A1* | 3/2025 | Lenhardt .............. H05K 3/0017 |

FOREIGN PATENT DOCUMENTS

| | | |
|---|---|---|
| JP | 2006-093576 A | 4/2006 |
| JP | 2018-067641 A | 4/2018 |
| JP | 2019-083303 A | 5/2019 |
| JP | 6630390 B2 | 1/2020 |

* cited by examiner

TERMINAL STRUCTURE AND ELECTRONIC COMPONENT

CROSS REFERENCE TO RELATED APPLICATION

This is a continuation of International Application No. PCT/JP2022/014934 filed on Mar. 28, 2022 which claims priority from Japanese Patent Application No. 2021-091922 filed on May 31, 2021. The contents of these applications are incorporated herein by reference in their entireties.

BACKGROUND OF THE DISCLOSURE

Field of the Disclosure

The present disclosure relates to a terminal structure including a plurality of rectangular cylindrical terminals, and an electronic component including such a terminal structure.

Description of the Related Art

Patent Literature 1 discloses a semiconductor device. The semiconductor device disclosed in Patent Literature 1 includes a semiconductor element, an element conductor, and a connecting conductor. The semiconductor element is connected to the connecting conductor by a bonding wire while being mounted on the element conductor.

The semiconductor element, the element conductor, the connecting conductor, and the bonding wire are covered with a sealing resin. At this time, one end surface of the element conductor and the connecting conductor is exposed from the sealing resin.

Fine irregularities are provided on an entire peripheral surface (a surface perpendicular to the end surface) of the element conductor and the connecting conductor. Accordingly, the bonding strength between an external connecting conductor (the element conductor and the connecting conductor) and the sealing resin is improved, and reliability as the device is increased.

[Patent Literature 1] Japanese Patent No. 6630390

BRIEF SUMMARY OF THE DISCLOSURE

However, with such a conventional structure disclosed in Patent Literature 1, the transmission loss of a high-frequency signal in the external connecting conductor is increased. Accordingly, the transmission characteristics as the device are reduced.

Therefore, the present disclosure is directed to provide a terminal structure capable of increasing reliability as a device (an electronic component) and significantly reducing a reduction in transmission characteristics.

A terminal structure of the present disclosure includes a plurality of first terminal pins and a plurality of second terminal pins. The plurality of first terminal pins are placed side by side in a first direction. The plurality of second terminal pins are placed to extend in parallel to the plurality of first terminal pins. The plurality of first terminal pins and the plurality of second terminal pins include an inside face facing each other, an outside face opposite to the inside face, and side faces connecting the inside face and the outside face. At least one of the side faces includes a first portion having a relatively rough surface, and a second portion having a relatively fine surface and having approximately the same roughness as the inside face and the outside face.

With this configuration, the transmission characteristics of a high-frequency signal is obtained by the second portion. Then, the bonding strength of a sealing resin covering the plurality of first terminal pins and the plurality of second terminal pins and each terminal pin is obtained by the first portion. In addition, although a distance between the plurality of first terminal pins and between the plurality of second terminal pins is small, the first portion present in this position is able to improve the bonding strength in a position with which the sealing resin is not easily filled up.

According to the present disclosure, the reliability as a device (an electronic component) is able to be increased, and a reduction in transmission characteristics is able to be significantly reduced.

BRIEF DESCRIPTION OF THE SEVERAL VIEWS OF THE DRAWINGS

FIG. 2 is a side cross-sectional view taken along a line A-A in FIG. 1A showing the electronic component according to the first exemplary embodiment.

FIG. 3A is a bottom view of a terminal structure according to the first exemplary embodiment, and FIG. 3B is an enlarged side view of a portion of the terminal structure according to the first exemplary embodiment.

FIG. 5A is a bottom view of a terminal structure according to a second exemplary embodiment of the present disclosure, and FIG. 5B is an enlarged side view of the portion of the terminal structure according to the second exemplary embodiment.

FIG. 6 is a bottom view of an electronic component according to the second exemplary embodiment.

FIG. 9 is a side cross-sectional view of an electronic component according to a fifth exemplary embodiment of the present disclosure.

DETAILED DESCRIPTION OF THE DISCLOSURE

First Exemplary Embodiment

Figures 1A, 1B:
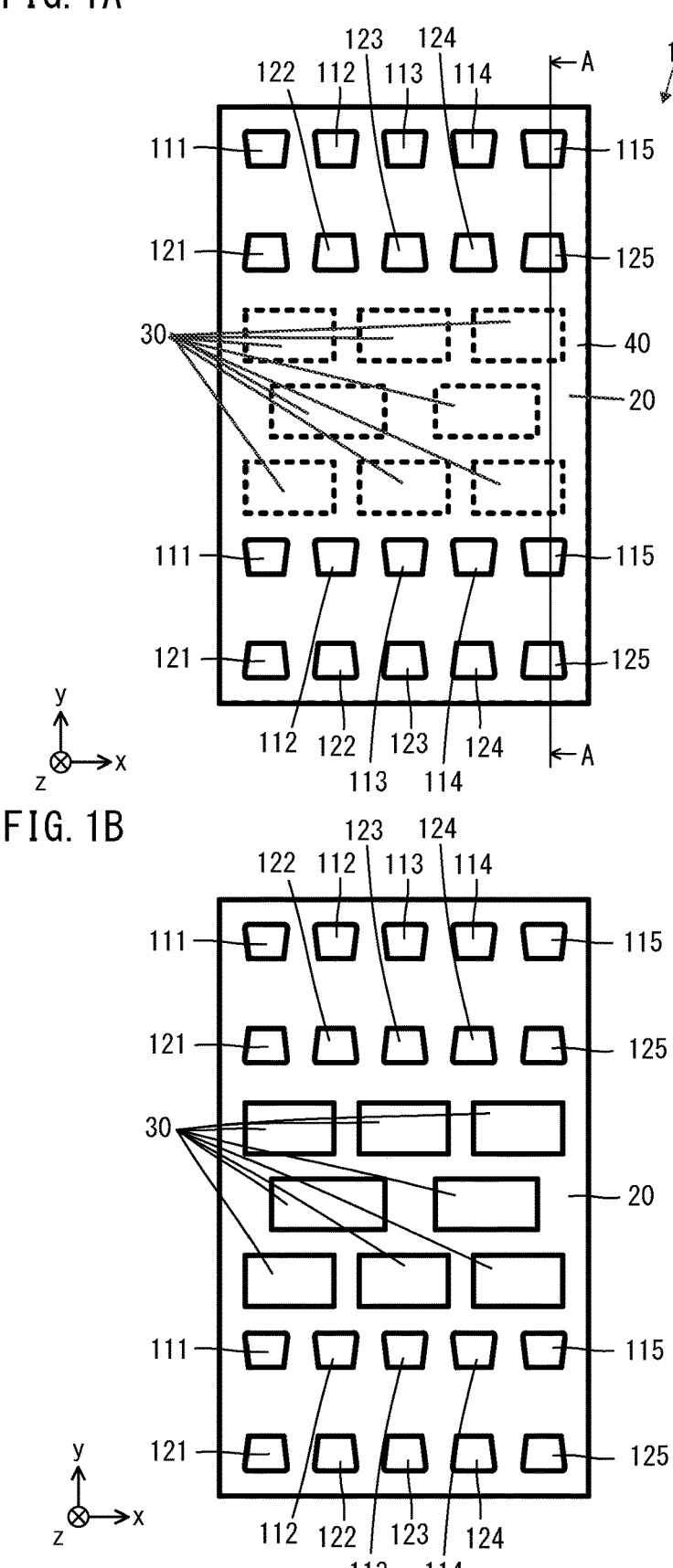
FIG. 1A is a bottom view of an electronic component according to a first exemplary embodiment of the present disclosure.
FIG. 1B is a bottom view of the electronic component according to the first exemplary embodiment from which an insulating resin is omitted.
Figure 2:
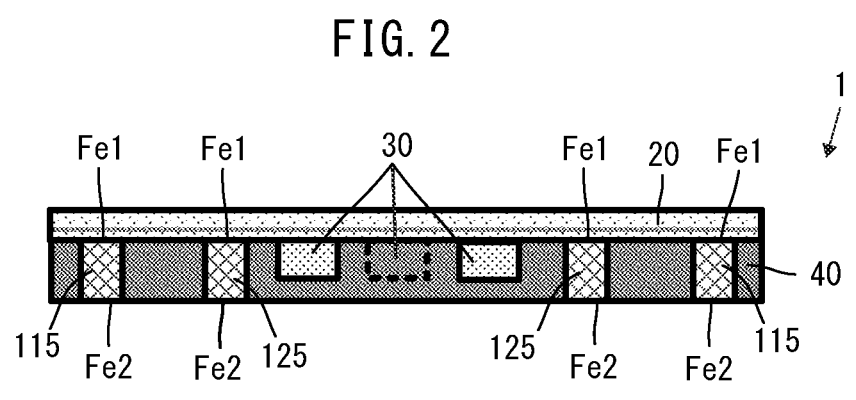
Figures 3A, 3B:
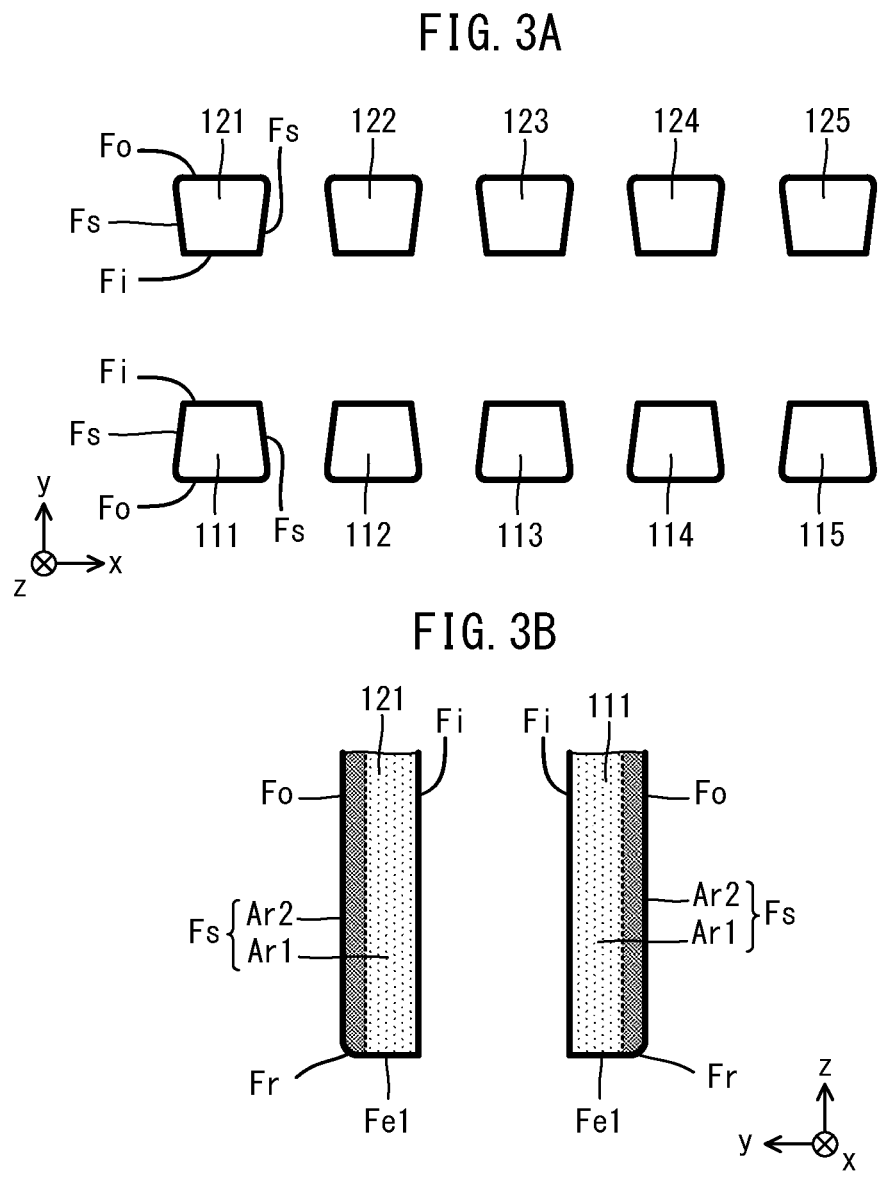
Figure 4:
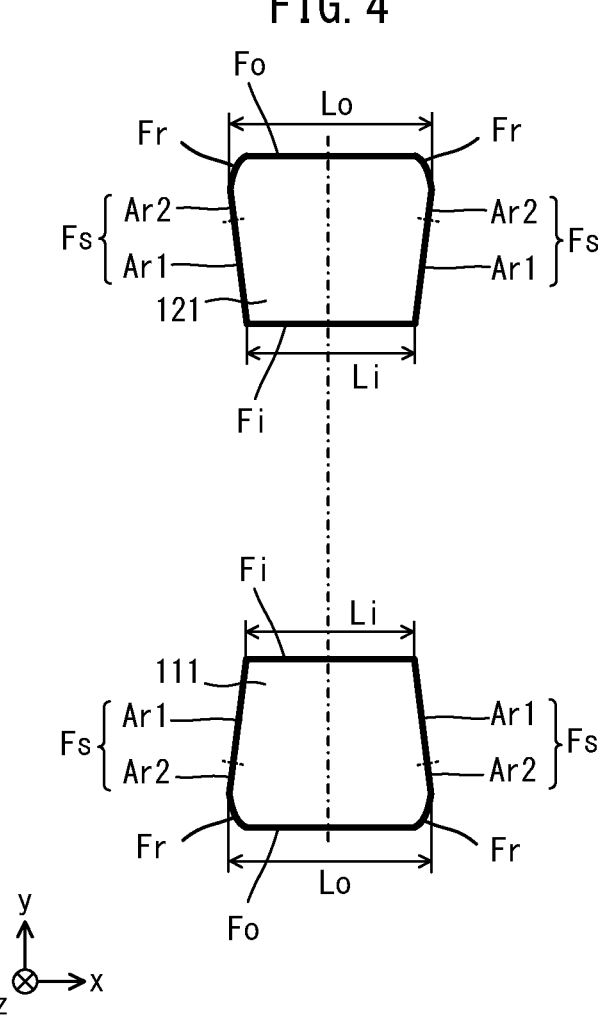
FIG. 4 is an enlarged bottom view of the portion of the terminal structure according to the first exemplary embodiment.

A terminal structure and an electronic component according to a first exemplary embodiment of the present disclosure will be described with reference to drawings. FIG. 1A is a bottom view of an electronic component according to the first exemplary embodiment of the present disclosure, and FIG. 1B is a bottom view of the electronic component according to the first exemplary embodiment from which an insulating resin is omitted. FIG. 2 is a side cross-sectional view taken along a line A-A in FIG. 1A showing the electronic component according to the first exemplary embodiment. FIG. 3A is a bottom view of a terminal structure according to the first exemplary embodiment, and FIG. 3B is an enlarged side view of a portion of the terminal structure according to the first exemplary embodiment. FIG. 4 is an enlarged bottom view of the portion of the terminal structure according to the first exemplary embodiment. It is to be noted that, in each drawing, in order to make the drawings easy to see, some reference signs are omitted. An omitted reference sign is able to be referred to, for example, by a drawing different from a drawing from which the reference sign is omitted.

As shown in FIG. 1A and FIG. 1B, an electronic component 1 includes a plurality of terminal pins 111 to 115, a substrate 20, a mount component 30, and an insulating resin 40.

The plurality of terminal pins 111 to 115 and a plurality of terminal pins 121 to 125 are made of a conductor. For example, the plurality of terminal pins 111 to 115 and the plurality of terminal pins 121 to 125 are made of a metal (copper, for example).

The terminal pin 111, the terminal pin 112, the terminal pin 113, the terminal pin 114, and the terminal pin 115 are placed side by side in a first direction (an x-axis direction in the drawings). At this time, the terminal pin 111, the terminal pin 112, the terminal pin 113, the terminal pin 114, and the terminal pin 115 are placed at a distance from each other. Each of the terminal pin 111, the terminal pin 112, the terminal pin 113, the terminal pin 114, and the terminal pin 115 corresponds to a "first terminal pin" of the present disclosure.

The terminal pin 121, the terminal pin 122, the terminal pin 123, the terminal pin 124, and the terminal pin 125 are placed side by side in the first direction (the x-axis direction in the drawings). At this time, the terminal pin 121, the terminal pin 122, the terminal pin 123, the terminal pin 124, and the terminal pin 125 are placed at a distance from each other. Each of the terminal pin 121, the terminal pin 122, the terminal pin 123, the terminal pin 124, and the terminal pin 125 corresponds to a "second terminal pin" of the present disclosure.

The terminal pin 111 and the terminal pin 121 are arranged side by side at a distance in a second direction (a y-axis direction in the drawings) perpendicular to the first direction. Similarly, in the second direction, the terminal pin 112 and the terminal pin 122 are arranged side by side at a distance, and the terminal pin 113 and the terminal pin 123 are arranged side by side at a distance. The terminal pin 114 and the terminal pin 124 are arranged side by side at a distance, and the terminal pin 115 and the terminal pin 125 are arranged side by side at a distance.

The plurality of terminal pins 111 to 115 and the plurality of terminal pins 121 to 125 each have a rectangular cylindrical shape extending in a third direction (a z-axis direction in the drawings) perpendicular to the first direction and the second direction. As shown in FIG. 2, the plurality of terminal pins 111 to 115 and the plurality of terminal pins 121 to 125 each have an end face Fe1 at a first end in an extension direction being the third direction, and have an end face Fe2 at a second end in the extension direction. The plurality of terminal pins 111 to 115 and the plurality of terminal pins 121 to 125 are approximately rectangular cylinders including detailed features to be described below.

The plurality of terminal pins 111 to 115 and the plurality of terminal pins 121 to 125 each include side faces perpendicular to the end face Fe1 and the end face Fe2. The side faces include an inside face Fi, an outside face Fo, and two side faces Fs.

The plurality of terminal pins 111 to 115 and the plurality of terminal pins 121 to 125 have approximately the same shape. It is to be noted that the specific shape of the terminal pins will be described below.

The substrate 20 includes a plate-shaped insulating base material and a conductor pattern provided on the insulating base material. The substrate 20 corresponds to a "circuit board" of the present disclosure.

The mount component 30 includes an active component such as an IC, and a passive component such as a resistor, an inductor, or a capacitor, for example.

The plurality of terminal pins 111 to 115, the plurality of terminal pins 121 to 125, and a plurality of mount components 30 are mounted on the substrate 20. For example, FIG. 1A, FIG. 1B, and FIG. 2 show two sets of the plurality of terminal pins 111 to 115 and the plurality of terminal pins 121 to 125. The two sets of the plurality of terminal pins 111 to 115 and 121 to 125 are placed so as to face each other across the mounting region of the plurality of mount components 30. It is to be noted that the number of sets of the plurality of terminal pins 111 to 115 and 121 to 125, the number of mount components 30, and the arrangement patterns of such components are not limited to this example, and are able to be properly set according to the specifications of the electronic component 1.

The plurality of terminal pins 111 to 115 and the plurality of terminal pins 121 to 125, by the end face Fe1 being solder bonded (illustration of a solder bonding portion is omitted) to a land electrode of the substrate 20, are mounted on the substrate 20.

The insulating resin 40 covers the substrate 20, the plurality of mount components 30, the plurality of terminal pins 111 to 115, and the plurality of terminal pins 121 to 125. At this time, the end face Fe2 of the plurality of terminal pins 111 to 115 and the plurality of terminal pins 121 to 125 is exposed to the outside from the insulating resin 40.

The electronic component 1 of such a configuration is manufactured as follows, for example. First, the plurality of terminal pins 111 to 115, the plurality of terminal pins 121 to 125, and the plurality of mount components 30 are mounted on the substrate 20, for example, by solder bonding or the like.

Next, the insulating resin 40 covers a composite member including the plurality of terminal pins 111 to 115, the plurality of terminal pins 121 to 125, the plurality of mount components 30, and the substrates 20. The insulating resin 40 is formed by a compression mold method in which insulating resin particles are filled, and heated and pressurized, for example.

Then, the insulating resin 40 is ground so as to make the end face Fe2 of the plurality of terminal pins 111 to 115 and the plurality of terminal pins 121 to 125 exposed.

(Specific Configuration of Plurality of Terminal Pins 111 to 115, 121 to 125)

A pair of the terminal pin 111 and the terminal pin 121, a pair of the terminal pin 112 and the terminal pin 122, a pair of the terminal pin 113 and the terminal pin 123, a pair of the terminal pin 114 and the terminal pin 124, and a pair of the terminal pin 115 and the terminal pin 125 have substantially the same configuration, so that the following description uses the pair of the terminal pin 111 and the terminal pin 121.

The terminal pin 111 and the terminal pin 121 include the side faces that partially face each other, and such facing faces are the inside face Fi of the terminal pin 111 and the inside face Fi of the terminal pin 121.

(Terminal Pin 111)

The outside face Fo of the terminal pin 111 is a surface of the terminal pin 111 opposite to a surface that faces the terminal pin 121, and a surface substantially parallel to the inside face Fi.

The two side faces Fs of the terminal pin 111 connect the inside face Fi and the outside face Fo. More specifically, a first side face Fs connects a first end of the inside face Fi and a first end of the outside face Fo. A second side face Fs connects a second end of the inside face Fi and a second end of the outside face Fo. Accordingly, the terminal pin 111 achieves an approximately rectangular cylindrical shape extending in the third direction.

As shown in FIG. 3A and FIG. 4, a length Li of the inside face Fi in the first direction (the direction in which the plurality of terminal pins 111 to 115 are placed side by side) is smaller than a length Lo of the outside face Fo in the first direction. Then, the center of the inside face Fi in the first direction substantially coincides with the center of the outside face Fo in the first direction. Accordingly, the terminal pin 111 has a shape in which the length in the first direction is decreased as approaching the terminal pin 121, and the shape viewed in a direction perpendicular to the end faces Fe1 and Fe2 has a tapered shape.

The outside face Fo and the side face Fs are connected by a rounded face Fr. The rounded face Fr has a shape (a shape in which the center of an arc showing the rounded face Fr is near the inside of the terminal pin) that expands outward. Accordingly, when the terminal pin 111 is viewed in the direction perpendicular to the end faces Fe1 and Fe2, a connection portion between the outside face Fo and the side face Fs has a round chamfered shape.

In addition, as shown in FIG. 3B, the outside face Fo and the end face Fe1 are connected by the rounded face Fr. In other words, when the terminal pin 111 is viewed in a direction substantially perpendicular to the side face Fs, a connection portion between the outside face Fo and the end face Fe1 has a round chamfered shape.

The side face Fs includes a first portion Ar1 and a second portion Ar2. The first portion Ar1 is a surface near a side that connects the inside face Fi, and the second portion Ar2 is a surface near a side that connects the outside face Fo.

The surface of the first portion Ar1 is rougher than the surface of the second portion Ar2. In other words, the surface roughness of the first portion Ar1 is larger than the surface roughness of the second portion Ar2. The first portion Ar1 and the second portion Ar2 each have the same surface roughness over approximately the entire surface in an extension direction in which the first portion Ar1 and the second portion Ar2 extend.

The surface roughness of the second portion AR2 is equivalent to the surface roughness of the inside face Fi and the surface roughness of the outside face Fo. It is to be noted that the surface roughness of the second portion Ar2, the surface roughness of the inside face Fi, and the surface roughness of the outside face Fo may be different from each other.

(Terminal Pin 121)

The outside face Fo of the terminal pin 121 is a surface of the terminal pin 121 opposite to a surface that faces the terminal pin 111, and a face substantially parallel to the inside face Fi.

The two side faces Fs of the terminal pin 121 connect the inside face Fi and the outside face Fo. More specifically, a first side face Fs connects a first end of the inside face Fi and a first end of the outside face Fo. A second side face Fs connects a second end of the inside face Fi and a second end of the outside face Fo. Accordingly, the terminal pin 121 achieves an approximately rectangular cylindrical shape extending in the third direction.

As shown in FIG. 3A and FIG. 4, the length Li of the inside face Fi in the first direction (the direction in which the plurality of terminal pins 121 to 125 are placed side by side) is smaller than the length Lo of the outside face Fo in the first direction. Then, the center of the inside face Fi in the first direction substantially coincides with the center of the outside face Fo in the first direction. Accordingly, the terminal pin 121 has a shape in which the length in the first direction is decreased as approaching the terminal pin 111, and the shape viewed in the direction perpendicular to the end faces Fe1 and Fe2 has a tapered shape.

The outside face Fo and the side face Fs are connected by a rounded face Fr. The rounded face Fr has a shape (a shape in which the center of an arc showing the rounded face Fr is near the inside of the terminal pin) that expands outward. Accordingly, when the terminal pin 121 is viewed in the direction perpendicular to the end faces Fe1 and Fe2, the connection portion between the outside face Fo and the side face Fs has a round chamfered shape.

In addition, as shown in FIG. 3B, the outside face Fo and the end face Fe1 are connected by the rounded face Fr. In other words, when the terminal pin 121 is viewed in a direction substantially perpendicular to the side face Fs, the connection portion between the outside face Fo and the end face Fe1 has a round chamfered shape.

The side face Fs includes a first portion Ar1 and a second portion Ar2. The first portion Ar1 is a surface near a side that connects the inside face Fi, and the second portion Ar2 is a surface near a side that connects the outside face Fo.

The surface of the first portion Ar1 is rougher than the surface of the second portion Ar2. In other words, the surface roughness of the first portion Ar1 is larger than the surface roughness of the second portion Ar2. The first portion Ar1 and the second portion Ar2 each have the same surface roughness over approximately the entire surface in the extension direction. The surface roughness of the second portion Ar2 is equivalent to the surface roughness of the inside face Fi and the surface roughness of the outside face Fo. It is to be noted that the surface roughness of the second portion Ar2, the surface roughness of the inside face Fi, and the surface roughness of the outside face Fo may be different from each other.

According to such a configuration, the following operational effects are able to be obtained.

The plurality of terminal pins 111 to 115 and the plurality of terminal pins 121 to 125 each include the first portion Ar1 having a large surface roughness, so that the anchor effect by the irregularities of the first portion Ar1 is obtained. Accordingly, the electronic component 1 is able to improve the adhesiveness between the plurality of terminal pins 111 to 115 and the plurality of terminal pins 121 to 125, and the insulating resin 40 and is able to improve the bonding strength of such bonding portions.

In particular, the first portion Ar1 being on the side face Fs enables the electronic component 1 to improve the adhesiveness in a position with which the insulating resin 40 is comparatively difficult to be filled up. Further, the first portion Ar1 being on the side face Fs near the inside face Fi enables the electronic component 1 to improve the adhesiveness in a position with which the insulating resin 40 is more difficult to be filled up.

Furthermore, the insulating resin 40 filled in a portion surrounded with the plurality of terminal pins 111 to 115 and the plurality of terminal pins 121 to 125 is able to be significantly reduced from flowing to the outside. Accordingly, the electronic component 1 is able to improve resin filling property in the portion surrounded with the plurality of terminal pins 111 to 115 and the plurality of terminal pins 121 to 125 and improve reliability.

The second portion Ar2, the inside face Fi, and the outside face Fo that each have a small surface roughness enable the electronic component 1 to reduce the transmission loss of a high-frequency signal and to significantly reduce a reduction in transmission characteristics.

The round chamfered shape of the connection portion between the outside face Fo and the side face Fs improves the fluidity of the insulating resin 40. Accordingly, the electronic component 1 is able to more reliably fill with the insulating resin 40 the portion surrounded with the plurality of terminal pins 111 to 115 and the plurality of terminal pins 121 to 125.

In addition, during flux cleaning when the plurality of terminal pins 111 to 115 and the plurality of terminal pins 121 to 125 are mounted on the substrate 20 by solder or the like, the fluidity of cleaning solution is increased. Accordingly, the electronic component 1 is able to significantly reduce flux residue and can improve the reliability.

The round chamfered shape of the connection portion between the outside face Fo and the side face Fs is able to significantly reduce a distance between adjacent terminal pins in the plurality of terminal pins 111 to 115 and a distance between adjacent terminal pins in the plurality of terminal pins 121 to 125. Accordingly, the electronic component 1 is able to significantly reduce short-circuiting between the adjacent terminal pins in the plurality of terminal pins 111 to 115, and short-circuiting between the adjacent terminal pins in the plurality of terminal pins 121 to 125.

In addition, the round chamfered shape of the connection portion between the outside face Fo and the end face Fe1, when the plurality of terminal pins 111 to 115 and the plurality of terminal pins 121 to 125 are mounted on the substrate 20 by solder or the like, is able to fit the solder between a round chamfered portion and the land electrode of the substrate 20. Accordingly, the electronic component 1 is able to significantly reduce the solder from flowing from the plurality of terminal pins 111 to 115 and the plurality of terminal pins 121 to 125 to the outside. Therefore, the distance between the plurality of terminal pins 111 to 115, the plurality of terminal pins 121 to 125, and the mount components 30 is able to be reduced, and the electronic component 1 is able to be miniaturized.

In addition, the connection portion between the outside face Fo and the side face Fs and the connection portion between the outside face Fo and the end face Fe1 have a round chamfered shape, so that, when the plurality of terminal pins 111 to 115 and the plurality of terminal pins 121 to 125 are mounted on the substrate 20 by solder or the like, void included in the solder easily comes out. Accordingly, the electronic component 1 is able to improve the bonding reliability between the substrate 20, and the plurality of terminal pins 111 to 115 and the plurality of terminal pins 121 to 125.

In addition, the length Lo of the outside face Fo is larger than the length Li of the inside face Fi, so that the terminal pins 111 to 115 and the terminal pins 121 to 125 are able to be used for heat dissipation of the mount component 30 adjacent to these terminal pins. Accordingly, the electronic component 1 is able to achieve both miniaturization and heat dissipation performance.

Furthermore, the length Lo of the outside face Fo is larger than the length Li of the inside face Fi, so that the terminal pins 111 to 115 and the terminal pins 121 to 125 are able to be used as a shield member of the mount component 30 adjacent to these terminal pins. Accordingly, the electronic component 1 is able to improve the noise shielding performance of the mount component 30. In particular, as shown in FIG. 2, the two sets of the plurality of terminal pins 111 to 115 and the plurality of terminal pins 121 to 125 are placed so as to face each other across the mounting region of the mount components 30, so that the electronic component 1 is able to improve the noise shielding performance of the mount components 30.

Second Exemplary Embodiment

Figures 5A, 5B:
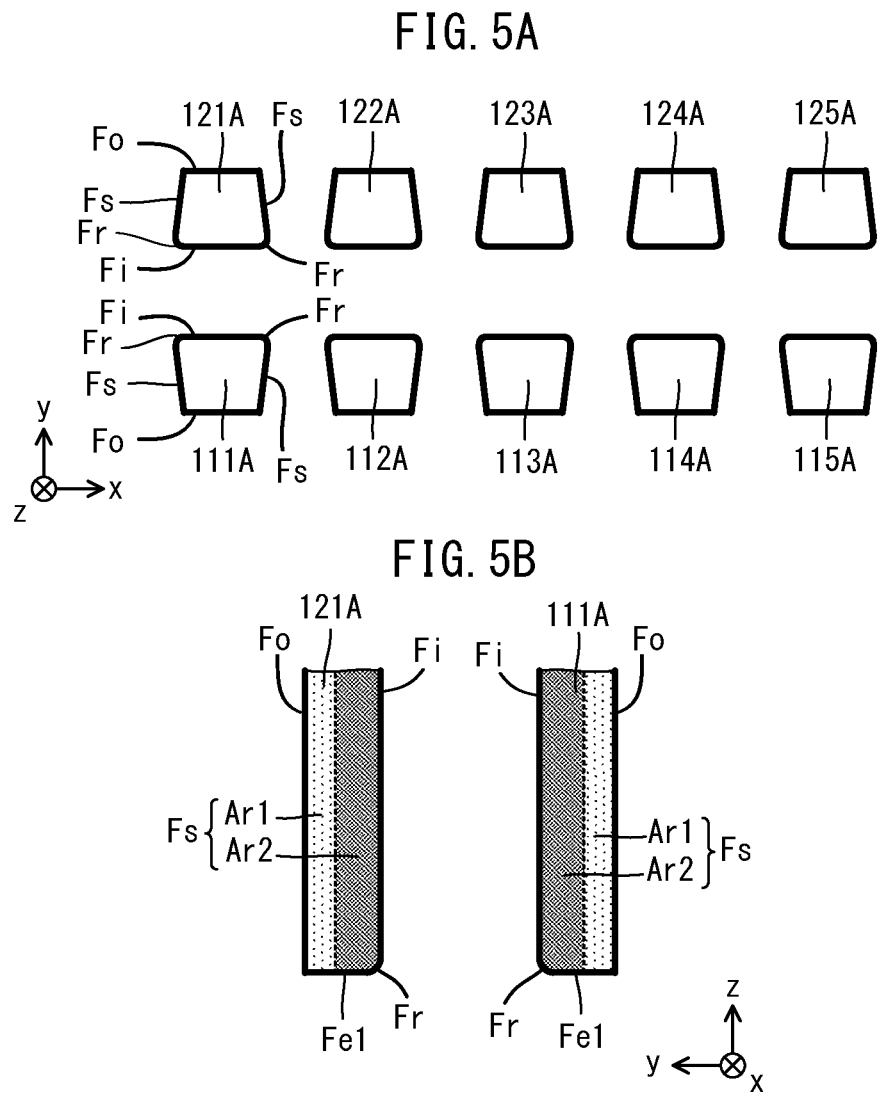
Figure 6:
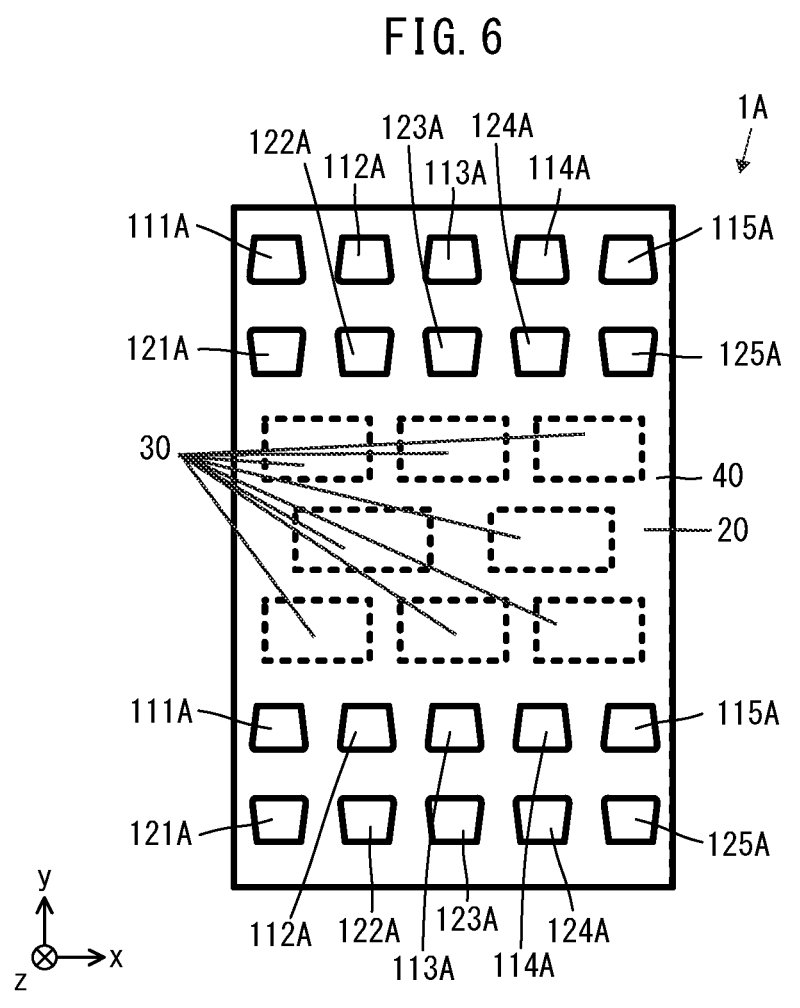

A terminal structure and an electronic component according to a second exemplary embodiment of the present disclosure will be described with reference to drawings. FIG. 5A is a bottom view of the terminal structure according to the second exemplary embodiment of the present disclosure, and FIG. 5B is an enlarged side view of the portion of the terminal structure according to the second exemplary embodiment. FIG. 6 is a bottom view of the electronic component according to the second exemplary embodiment.

As shown in FIG. 5A, FIG. 5B, and FIG. 6, the electronic component LA according to the second exemplary embodiment is different from the electronic component 1 according to the first exemplary embodiment in the arrangement of the plurality of terminal pins and the arrangement relationship between the plurality of terminal pins and the mount component 30. Other configurations of the electronic component LA are the same as or similar to the configurations of the electronic component 1, and a description of the same or similar configurations will be omitted.

The electronic component LA includes a plurality of terminal pins 111A to 115A (a terminal pin 111A, a terminal pin 112A, a terminal pin 113A, a terminal pin 114A, and a terminal pin 115A), and a plurality of terminal pins 121A to 125A (a terminal pin 121A, a terminal pin 122A, a terminal pin 123A, a terminal pin 124A, and a terminal pin 125A).

The plurality of terminal pins 111A to 115A and the plurality of terminal pins 121A to 125A each include an inside face Fi, an outside face Fo, and two side faces Fs.

A pair of the terminal pin 111A and the terminal pin 121A, a pair of the terminal pin 112A and the terminal pin 122A, a pair of the terminal pin 113A and the terminal pin 123A, a pair of the terminal pin 114A and the terminal pin 124A, and a pair of the terminal pin 115A and the terminal pin 125A have substantially the same configuration, so that the following description uses the pair of the terminal pin 111A and the terminal pin 121A.

(Terminal Pin 111A)

As shown in FIG. 5A, a length Li of the inside face Fi in a first direction (a direction in which the plurality of terminal pins 111A to 115A are placed side by side) is larger than a length Lo of the outside face Fo in the first direction. Then, the center of the inside face Fi in the first direction substantially coincides with the center of the outside face Fo in the first direction. Accordingly, the terminal pin 111A has a shape in which the length in the first direction is increased as approaching the terminal pin 121A, and the shape viewed in a direction perpendicular to end faces Fe1 and Fe2 has a tapered shape.

The inside face Fi and the side face Fs are connected by a rounded face Fr. The rounded face Fr is placed inside a point at which the extended lines of the inside face Fi and the side face Fs intersect, and has a shape in which the center expands more outward than both ends (connection ends with the inside face Fi and the side face Fs), when viewed in the direction perpendicular to the end faces Fe1 and Fe2. Accordingly, when the terminal pin 111A is viewed in the direction perpendicular to the end faces Fe1 and Fe2, a connection portion between the inside face Fi and the side face Fs has a round chamfered shape.

In addition, as shown in FIG. 5B, the inside face Fi and the end face Fe1 are connected by the rounded face Fr. In other words, when the terminal pin 111A is viewed in a direction substantially perpendicular to the side face Fs, a connection portion between the inside face Fi and the end face Fe1 has a round chamfered shape.

The side face Fs includes a first portion Ar1 and a second portion Ar2. The first portion Ar1 is a surface near a side that connects the inside face Fi, and the second portion Ar2 is a surface near a side that connects the outside face Fo. The surface of the first portion Ar1 is rougher than the surface of the second portion Ar2. In other words, the surface roughness of the first portion Ar1 is larger than the surface roughness of the second portion Ar2. The first portion Ar1 and the second portion Ar2 each have the same surface roughness over approximately the entire surface in the extension direction.

The surface roughness of the second portion Ar2 is equivalent to the surface roughness of the inside face Fi and the surface roughness of the outside face Fo. It is to be noted that the surface roughness of the second portion Ar2, the surface roughness of the inside face Fi, and the surface roughness of the outside face Fo may be different from each other.

(Terminal Pin 121A)

As shown in FIG. 5A, the length Li of the inside face Fi in the first direction (the direction in which the plurality of terminal pins 121A to 125A are placed side by side) is larger than the length Lo of the outside face Fo in the first direction. Then, the center of the inside face Fi in the first direction substantially coincides with the center of the outside face Fo in the first direction. Accordingly, the terminal pin 121A has a shape in which the length in the first direction is increased as approaching the terminal pin 111A, and the shape viewed in the direction perpendicular to the end faces Fe1 and Fe2 has a tapered shape.

The inside face Fi and the side face Fs are connected by a rounded face Fr. The rounded face Fr is placed inside a point at which the extended lines of the inside face Fi and the side face Fs intersect, and has a shape in which the center expands more outward than both ends (connection ends with the inside face Fi and the side face Fs), when viewed in the direction perpendicular to the end faces Fe1 and Fe2. Accordingly, when the terminal pin 121A is viewed in the direction perpendicular to the end faces Fe1 and Fe2, the connection portion between the inside face Fi and the side face Fs has a round chamfered shape.

In addition, as shown in FIG. 5B, the inside face Fi and the end face Fe1 are connected by the rounded face Fr. In other words, when the terminal pin 111A is viewed in a direction substantially perpendicular to the side face Fs, the connection portion between the inside face Fi and the end face Fe1 has a round chamfered shape.

The side face Fs includes a first portion Ar1 and a second portion Ar2. The first portion Ar1 is a surface near a side that connects the inside face Fi, and the second portion Ar2 is a surface near a side that connects the outside face Fo.

The surface of the first portion Ar1 is rougher than the surface of the second portion Ar2. In other words, the surface roughness of the first portion Ar1 is larger than the surface roughness of the second portion Ar2. The first portion Ar1 and the second portion Ar2 each have the same surface roughness over approximately the entire surface in the extension direction.

The surface roughness of the second portion AR2 is equivalent to the surface roughness of the inside face Fi and the surface roughness of the outside face Fo. It is to be noted that the surface roughness of the second portion Ar2, the surface roughness of the inside face Fi, and the surface roughness of the outside face Fo may be different from each other.

According to such a configuration, the following operational effects are able to be obtained.

The plurality of terminal pins 111A to 115A and the plurality of terminal pins 121A to 125A each include the first portion Ar1 having a large surface roughness, so that the anchor effect by the irregularities of the first portion Ar1 is obtained. Accordingly, the electronic component LA is able to improve the adhesiveness between the plurality of terminal pins 111A to 115A and the plurality of terminal pins 121A to 125A, and the insulating resin 40 and is able to improve the bonding strength of such bonding portions.

In particular, the first portion Ar1 being on the side face Fs enables the electronic component LA to improve the adhesiveness in a position with which the insulating resin 40 is comparatively difficult to be filled up. Further, the first portion Ar1 being on the side face Fs near the inside face Fi enables the electronic component LA to improve the adhesiveness in a position with which the insulating resin 40 is more difficult to be filled up.

Furthermore, the insulating resin 40 filled in a portion surrounded with the plurality of terminal pins 111A to 115A and the plurality of terminal pins 121A to 125A is able to be significantly reduced from flowing to the outside. Accordingly, the electronic component LA is able to improve resin filling property in the portion surrounded with the plurality of terminal pins 111A to 115A and the plurality of terminal pins 121A to 125A and improve reliability.

The second portion Ar2, the inside face Fi, and the outside face Fo that each have a small surface roughness enable the electronic component LA to reduce the transmission loss of a high-frequency signal and to significantly reduce a reduction in transmission characteristics.

The configuration having the round chamfered shape of the connection portion between the inside face Fi and the side face Fs, when the length Li of the inside face Fi is large, is able to more securely fill up with the insulating resin 40 the portion surrounded with the plurality of terminal pins 111A to 115A and the plurality of terminal pins 121A to 125A than the configuration having no round chamfered shape.

In addition, during flux cleaning when the plurality of terminal pins 111A to 115A and the plurality of terminal pins 121A to 125A are mounted on the substrate 20 by solder or the like, the fluidity of cleaning solution is increased. Accordingly, the electronic component LA is able to significantly reduce flux residue and can improve the reliability.

The round chamfered shape of the connection portion between the inside face Fi and the side face Fs is able to significantly reduce a distance between adjacent terminal pins in the plurality of terminal pins 111A to 115A and a distance between adjacent terminal pins in the plurality of terminal pins 121A to 125A. Accordingly, the electronic component LA is able to significantly reduce short-circuiting between the adjacent terminal pins in the plurality of terminal pins 111A to 115A, and short-circuiting between the adjacent terminal pins in the plurality of terminal pins 121A to 125A.

In addition, the round chamfered shape of the connection portion between the inside face Fi and the end face Fe1, when the plurality of terminal pins 111A to 115A and the plurality of terminal pins 121A to 125A are mounted on the substrate 20 by solder or the like, is able to fit the solder between a round chamfered portion and the land electrode of the substrate 20. Accordingly, the electronic component LA is able to significantly reduce the solder from flowing into the portion (between the terminal pin 111A and the terminal pin 121A, for example) surrounded with the plurality of terminal pins 111A to 115A and the plurality of terminal pins 121A to 125A. Therefore, a distance (a distance in the second direction) between the plurality of terminal pins 111A to 115A and the plurality of terminal pins 121A to 125A is able to be reduced. As a result, the area of a region in which the plurality of terminal pins 111A to 115A and the plurality of terminal pins 121A to 125A are placed is able to be reduced, which makes it possible to miniaturize the electronic component LA.

In addition, the connection portion between the inside face Fi and the side face Fs and the connecting portion between the inside face Fi and the end face Fe1 have a round chamfered shape, so that, when the plurality of terminal pins 111A to 115A and the plurality of terminal pins 121A to 125A are mounted on the substrate 20 by solder or the like, void included in the solder easily comes out. Accordingly, the electronic component LA is able to improve the bonding reliability between the substrate 20, and the plurality of terminal pins 111A to 115A and the plurality of terminal pins 121A to 125A.

In addition, the length Lo of the outside face Fo is smaller than the length Li of the inside face Fi, so that electromagnetic interference between the plurality of terminal pins 111A to 115A and the plurality of terminal pins 121A to 125A and the mount component 30 adjacent to the plurality of terminal pins 111A to 115A and the plurality of terminal pins 121A to 125A is able to be reduced. Accordingly, the electronic component LA is able to be further miniaturized.

Moreover, the distance between the plurality of terminal pins 111A to 115A and the plurality of terminal pins 121A to 125A, and the mount component 30 is reduced, so that the plurality of terminal pins 111A to 115A and the plurality of terminal pins 121A to 125A are able to be used as a heat dissipation member and noise shielding member of the mount component 30. Accordingly, the electronic component LA is able to improve heat dissipation performance and noise shielding performance.

It is to be noted that the above description shows an aspect configured by ten terminal pins. However, the number of terminal pins is not limited to this embodiment and is able to be set up properly. In addition, the number of first terminal pins and the number of second terminal pins that are respectively arranged side by side in the first direction need not be the same. Furthermore, the above embodiment shows an aspect in which the first terminal pin and the second terminal pin are arranged side by side in the second direction and respective inside faces Fi face each other over approximately the entire surface. However, when at least portions of the respective inside faces Fi face, the configuration of the present application is applicable.

In addition, the above description shows an aspect in which the electronic components 1 and LA include two sets of the same-shaped terminal pin groups. However, the electronic components 1 and LA may include both the group of the plurality of terminal pins 111 to 115 and the plurality of terminal pins 121 to 125 and the group of the plurality of terminal pins 111A to 115A and the plurality of terminal pins 121A to 125A.

Third Exemplary Embodiment

Figure 7:
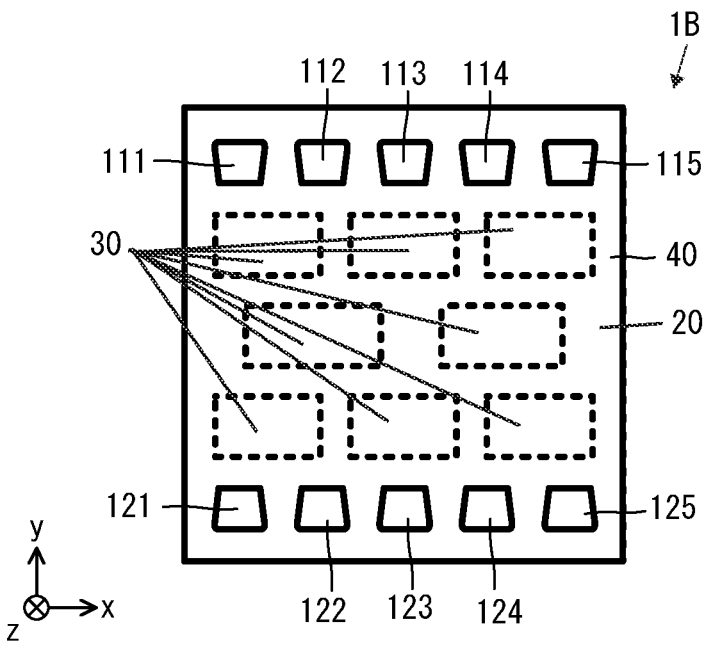
FIG. 7 is a bottom view of an electronic component according to a third exemplary embodiment of the present disclosure.

A terminal structure and an electronic component according to a third exemplary embodiment of the present disclosure will be described with reference to drawings. FIG. 7 is a bottom view of an electronic component according to the third exemplary embodiment of the present disclosure.

As shown in FIG. 7, the electronic component 1B according to the third exemplary embodiment is different from the electronic component 1 according to the first exemplary embodiment in that one set of the plurality of terminal pins 111 to 115 and one set of the plurality of terminal pins 121 to 125 are used. Other configurations of the electronic component 1B are the same as or similar to the configurations of the electronic component 1, and a description of the same or similar configurations will be omitted.

In the electronic component 1B, the plurality of terminal pins 111 to 115 are placed closer to a first side in the second direction than the plurality of mount components 30. The plurality of terminal pins 121 to 125 are placed closer to a second side in the second direction than the plurality of mount components 30. In other words, in the second direction, the plurality of terminal pins 111 to 115 and the plurality of terminal pins 121 to 125 are placed across the arrangement area of the plurality of mount components 30.

With such a configuration as well, the electronic component 1B is able to obtain the same effects and advantages as the effects and advantages of the electronic component 1.

Fourth Exemplary Embodiment

Figure 8:
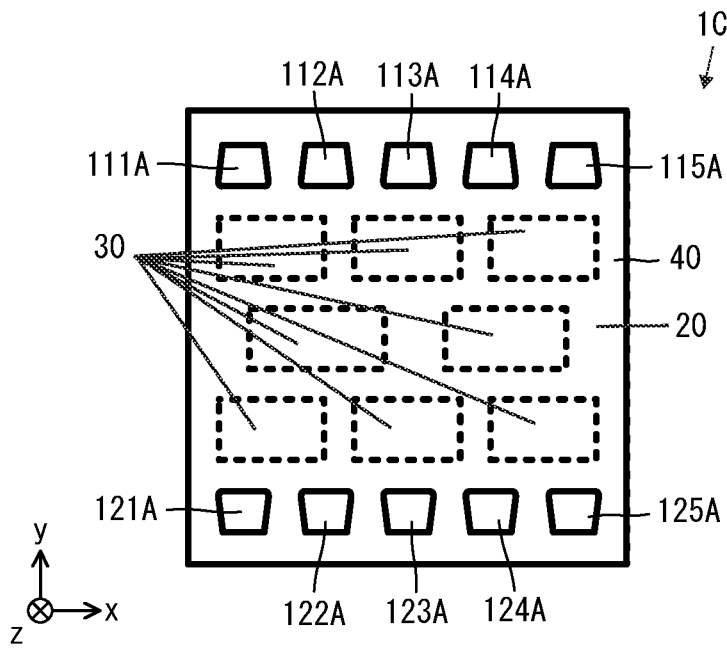
FIG. 8 is a bottom view of an electronic component according to a fourth exemplary embodiment of the present disclosure.

A terminal structure and an electronic component according to a fourth exemplary embodiment of the present disclosure will be described with reference to drawings. FIG. 8 is a bottom view of an electronic component according to the fourth exemplary embodiment of the present disclosure.

As shown in FIG. 8, the electronic component 1C according to the fourth exemplary embodiment is different from the electronic component LA according to the second exemplary embodiment in that one set of the plurality of terminal pins 111A to 115A and one set of the plurality of terminal pins 121A to 125A are used. Other configurations of the electronic component 1C are the same as or similar to the configurations of the electronic component LA, and a description of the same or similar configurations will be omitted.

In the electronic component 1C, the plurality of terminal pins 111A to 115A are placed closer to a first side in the second direction than the plurality of mount components 30. The plurality of terminal pins 121A to 125A are placed closer to a second side in the second direction than the plurality of mount components 30. In other words, in the second direction, the plurality of terminal pins 111A to 115A and the plurality of terminal pins 121A to 125A are placed across the arrangement area of the plurality of mount components 30.

With such a configuration as well, the electronic component 1C is able to obtain the same effects and advantages as the effects and advantages of the electronic component LA.

Fifth Exemplary Embodiment

Figure 9:
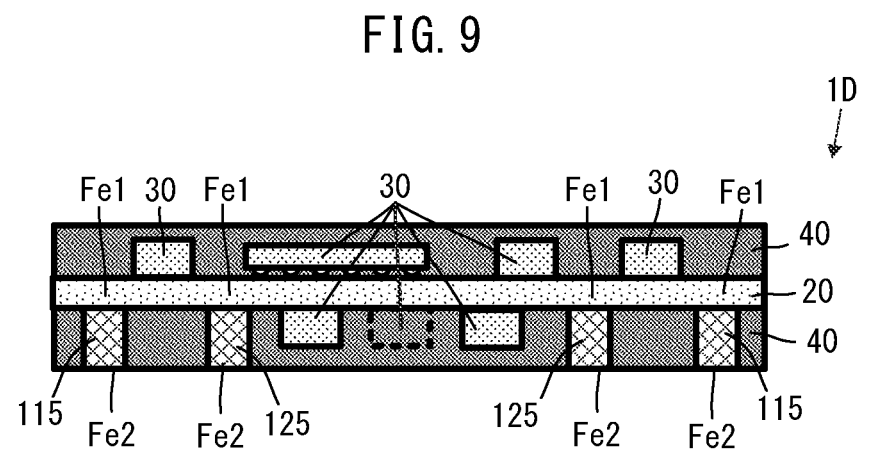

A terminal structure and an electronic component according to a fifth exemplary embodiment of the present disclosure will be described with reference to drawings. FIG. 9 is a side cross-sectional view of an electronic component according to the fifth exemplary embodiment of the present disclosure.

As shown in FIG. 9, the electronic component 1D according to the fifth exemplary embodiment is different from the electronic component 1 according to the first exemplary embodiment in that the mount component 30 is mounted on both surfaces of the substrate 20. Other configurations of the electronic component 1D are the same as or similar to the configurations of the electronic component 1, and a description of the same or similar configurations will be omitted.

The plurality of mount components 30 are mounted on the surface (the back surface) of the substrate 20 on which the plurality of terminal pins 111 to 115 and the plurality of terminal pins 121 to 125 are mounted, and also on the surface (the front surface) on the opposite side. The front surface of the substrate 20 and the plurality of mount components 30 mounted on the front surface are covered with the insulating resin 40.

With such a configuration as well, the electronic component 1D is able to obtain the same effects and advantages as the effects and advantages of the electronic component 1.

1, 1A, 1B, 1C, 1D: electronic component
20: substrate
30: mount component
40: insulating resin
111 to 115, 111A to 115A, 121 to 125, 121A to 125A: terminal pin
Ar1: first portion
Ar2: second portion
Fe1: end face
Fe2: end face
Fi: inside face
Fo: outside face
Fr: rounded face
Fs: side face

The invention claimed is:

1. A terminal structure comprising:
at least one first terminal pin; and
at least one second terminal pin, wherein:
each of the first terminal pin and the second terminal pin includes an inside face facing each other, an outside face each opposite to the inside face, and a pair of side faces each connecting the inside face and the outside face; and
at least one of the side faces includes a first portion having a relatively rougher surface than a second portion having a same roughness as the inside face and the outside face.

2. The terminal structure according to claim 1, wherein:
the first terminal pin includes a plurality of first terminal pins and the second terminal pin includes a plurality of second terminal pins; and
the plurality of first terminal pins and the plurality of second terminal pins are respectively placed in a first direction to extend in parallel with each other.

3. The terminal structure according to claim 1, wherein the first portion is closer to a side on which the first terminal pin and the second terminal pin are adjacent to each other than the second portion.

4. The terminal structure according to claim 1, wherein, when viewed in a direction in which the first terminal pin and the second terminal pin extend, a length of the inside face is different from a length of the outside face.

5. The terminal structure according to claim 4, wherein a portion in which a longer side of the inside face and the outside face is connected to each of the side faces has a round chamfered shape.

6. An electronic component comprising:
the terminal structure according to claim 1;
a circuit board on which a first end of the first terminal pin and the second terminal pin is mounted, the first end being in an extension direction in which the first terminal pin and the second terminal pin extend; and
an insulating resin covering the circuit board and covering an entirety of the first terminal pin and the second terminal pin except for a second end of the first terminal pin and the second terminal pin in the extension direction.

7. The terminal structure according to claim 2, wherein the first portion is closer to a side on which the first terminal pin and the second terminal pin are adjacent to each other than the second portion.

8. The terminal structure according to claim 2, wherein, when viewed in a direction in which the first terminal pin and the second terminal pin extend, a length of the inside face is different from a length of the outside face.

9. The terminal structure according to claim 3, wherein, when viewed in a direction in which the first terminal pin and the second terminal pin extend, a length of the inside face is different from a length of the outside face.

10. An electronic component comprising:
the terminal structure according to claim 2;
a circuit board on which a first end of the first terminal pin and the second terminal pin is mounted, the first end being in an extension direction in which the first terminal pin and the second terminal pin extend; and
an insulating resin covering the circuit board and covering an entirety of the first terminal pin and the second terminal pin except for a second end of the first terminal pin and the second terminal pin in the extension direction.

11. An electronic component comprising:
the terminal structure according to claim 3;
a circuit board on which a first end of the first terminal pin and the second terminal pin is mounted, the first end being in an extension direction in which the first terminal pin and the second terminal pin extend; and
an insulating resin covering the circuit board and covering an entirety of the first terminal pin and the second terminal pin except for a second end of the first terminal pin and the second terminal pin in the extension direction.

12. An electronic component comprising:
the terminal structure according to claim 4;
a circuit board on which a first end of the first terminal pin and the second terminal pin is mounted, the first end being in an extension direction in which the first terminal pin and the second terminal pin extend; and
an insulating resin covering the circuit board and covering an entirety of the first terminal pin and the second terminal pin except for a second end of the first terminal pin and the second terminal pin in the extension direction.

13. An electronic component comprising:
the terminal structure according to claim 5;
a circuit board on which a first end of the first terminal pin and the second terminal pin is mounted, the first end being in an extension direction in which the first terminal pin and the second terminal pin extend; and
an insulating resin covering the circuit board and covering an entirety of the first terminal pin and the second terminal pin except for a second end of the first terminal pin and the second terminal pin in the extension direction.

* * * * *